US005670742A

United States Patent [19]
Jones

[11] Patent Number: 5,670,742
[45] Date of Patent: Sep. 23, 1997

[54] EMI PROTECTED AIRCRAFT

[75] Inventor: Scott A. Jones, Prides Crossing, Mass.

[73] Assignee: Threshold Technologies, Inc., Carmel, Ind.

[21] Appl. No.: 191,096

[22] Filed: Feb. 4, 1994

[51] Int. Cl.⁶ .................................................. H05K 9/00
[52] U.S. Cl. ........................................ 174/35 R; 361/818
[58] Field of Search ............................ 174/35 R, 36, 174/35 C, 35 SM, 356 C, 35 MJ; 219/740; 361/816, 818

[56] References Cited

U.S. PATENT DOCUMENTS

| 1,482,642 | 2/1924 | Dinkela . | |
| 2,276,700 | 3/1942 | Provenzano . | |
| 2,497,924 | 2/1950 | Beach . | |
| 3,431,348 | 3/1969 | Nellis et al. | 219/740 |
| 3,965,285 | 6/1976 | Hill . | |
| 4,008,383 | 2/1977 | Tanaka et al. | 219/740 |
| 4,051,341 | 9/1977 | Tanaka et al. | 219/740 |
| 4,291,851 | 9/1981 | Johnson . | |
| 4,623,951 | 11/1986 | DuPont et al. . | |
| 4,631,214 | 12/1986 | Hasegawa | 174/35 MS |
| 4,746,389 | 5/1988 | DiGenova | 174/35 MS |
| 4,831,491 | 5/1989 | Mueller et al. . | |
| 4,842,553 | 6/1989 | Ingram . | |
| 4,932,755 | 6/1990 | Holdridge et al. | 174/35 MS |
| 5,031,862 | 7/1991 | Rhodes . | |
| 5,099,621 | 3/1992 | Schacklette et al. . | |
| 5,110,669 | 5/1992 | Knobel et al. . | |
| 5,127,601 | 7/1992 | Schroeder . | |
| 5,132,490 | 7/1992 | Aldissi . | |
| 5,136,119 | 8/1992 | Leyland | 174/35 MS |
| 5,151,819 | 9/1992 | Stephens . | |
| 5,158,707 | 10/1992 | Vestberg et al. . | |
| 5,177,324 | 1/1993 | Carr et al. . | |
| 5,186,861 | 2/1993 | Schellekens et al. . | |
| 5,194,985 | 3/1993 | Hilton, Sr. . | |
| 5,206,459 | 4/1993 | Aldissi . | |
| 5,225,110 | 7/1993 | Kathirgamanathan . | |
| 5,225,265 | 7/1993 | Prandy et al. . | |
| 5,250,342 | 10/1993 | Lang et al. | 174/35 MS |
| 5,262,588 | 11/1993 | Gallagher | 174/35 MS |
| 5,352,565 | 10/1994 | Schroeder | 174/35 MS |
| 5,373,102 | 12/1994 | Ehrlich et al. | 174/35 MS |

Primary Examiner—Teresa J. Walberg
Assistant Examiner—Sam Paik
Attorney, Agent, or Firm—Staas & Halsey

[57] ABSTRACT

A device for shielding aircraft avionics and other electronic equipment from electromagnetic radiation generated by electronic devices used aboard the aircraft. The device includes a contiguous conductive shield which can be of wire mesh and which partially or completely surrounds a compartment or compartments of the aircraft, such as the passenger compartment and cargo compartments, and absorbs and dissipates the electromagnetic radiation which originates in the compartment from the electronic devices. The aircraft windows are also shielded with the conductive shield or, alternatively, may be coated with a transparent thin conductive polymer to allow better viewing.

30 Claims, 8 Drawing Sheets

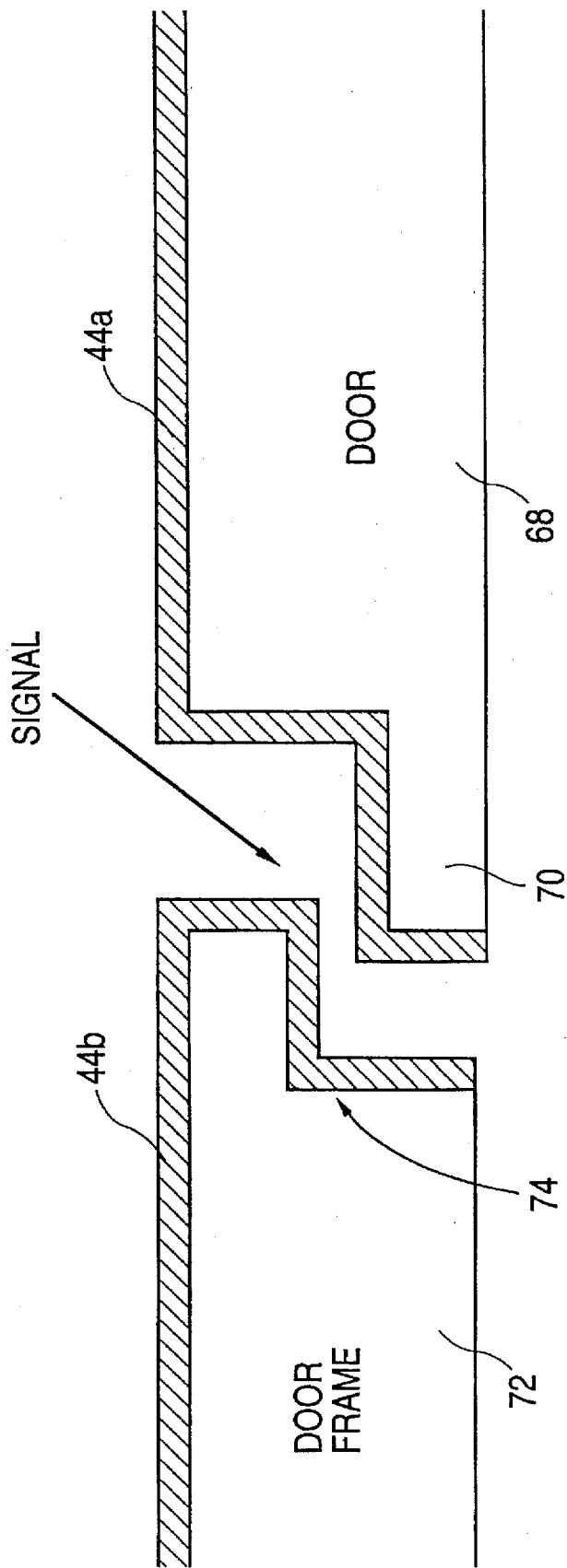

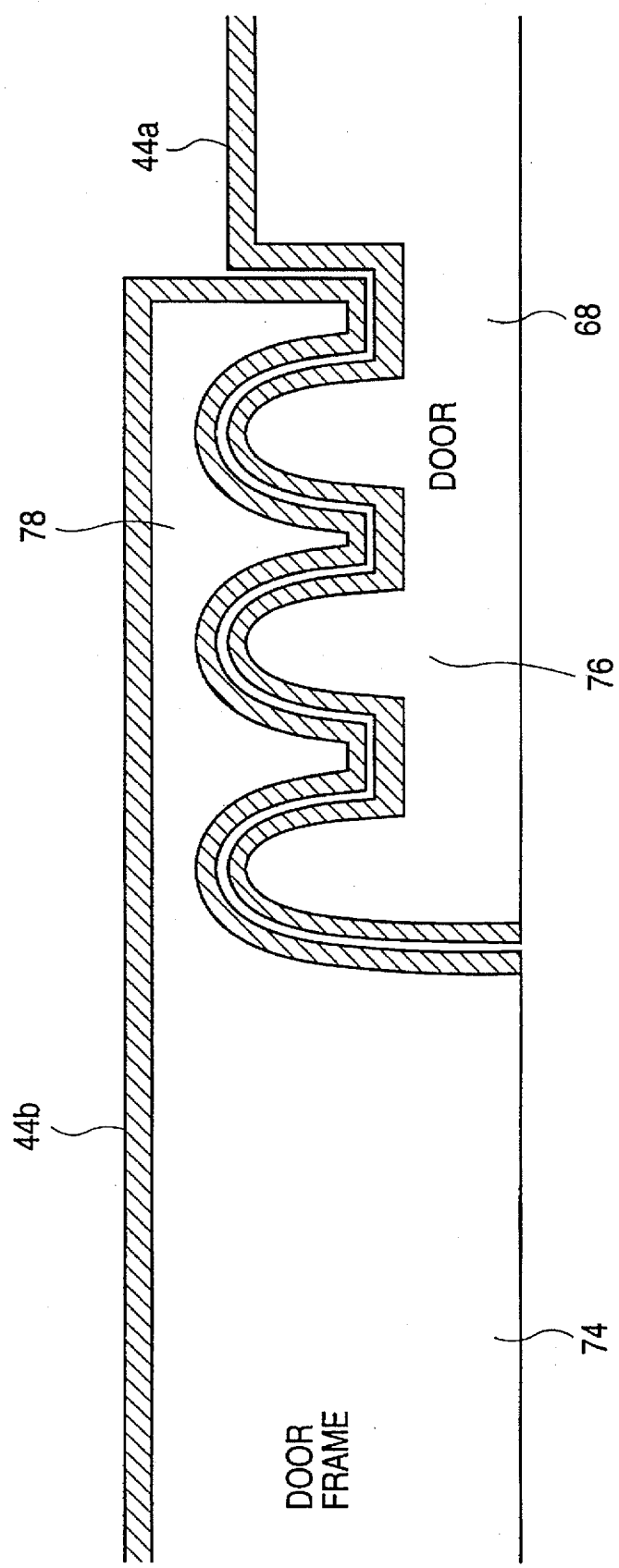

EMI PROTECTED AIRCRAFT

BACKGROUND OF THE INVENTION

1. Field of the Invention

The present invention relates to shielding for an aircraft which protects the aircraft's avionics and other electronic equipment from electromagnetic interference generated by electronic devices in use aboard the aircraft and, more particularly, to a conductive shield including conductive windows which may completely or partially surround the passenger compartment or cargo compartment.

2. Description of the Related Art

Electronic devices, including portable consumer electronics products such as portable computers, cellular phones, portable electronic games, radios, portable compact disc players, electric razors, etc. have become widely available in recent years as a result of advances in technology which have made possible the miniaturization of electronic components. The increased portability of electronic devices has caused them to become widely utilized in a variety of places. An extremely popular place where electronic devices are used is during airplane travel, particularly during long airplane flights. For example, executives travelling by airplane on business often use both a personal computer and cellular phone to conduct business. Portable video games, portable tape players, portable CD players, or portable radios are often used during flight for entertainment.

Recently there has been great concern over the use of electronic devices aboard aircraft. Specifically, there is concern that the electronic devices act as sources of electromagnetic interference CEMI") which affect an aircraft's avionics and other electronic equipment with potentially disastrous results if the interference occurs at an inopportune time during a flight, such as take-off or landing. As a precaution passengers are routinely requested to turn off all electronic devices during take-off and landing, something that is beginning to annoy the airline customers since significant portions of the short haul flights are in the take-off and landing mode.

Some electronic devices may interfere with the aircraft's avionics and other aircraft electronic equipment by giving off radio frequency CRF") emissions as a result of their operation. RF emission can be a form of EMI. Transmitting devices, such as cellular phones, generate strong narrow band RF signals, while nontransmitting devices, such as laptop computers, emit weak but broadband RF signals as a side effect of their operation. Modern digital avionics systems are becoming increasingly susceptible to interference caused by the RF emissions, especially strong signals, because they utilize smaller circuit elements which require less energy to be damaged or to change their state. Because of the varying conductor lengths between circuits in the systems and because of exposed connections, the systems are also susceptible to weak broadband interference. FIG. 1 is a chart showing an example of the frequencies generated by various EMI sources compared to the frequencies of avionics operating sources. If passenger's electronic devices produce radiation at the critical frequencies of the avionics operating sources or intermediate signals with enough strength, they could confuse or disable an aircraft's avionics and other aircraft electronic equipment including navigation and communication gear.

Another problem arises as a result of RF signals from cellular phones which escape the aircraft and activate all cell sites which are within the line of sight of the aircraft. This problem wreaks havoc among cellular phone service providers.

Yet another problem, stemming from the political and social instabilities in the world today, is that devices could be designed to intentionally interfere with aircraft systems. These devices could be placed in the passenger compartment or cargo compartment and activated to bring the aircraft down by disabling the avionics or other aircraft electronic equipment. The security problems associated with discriminating which devices may be used to disable the aircraft and which are harmless would create tremendous difficulties for both the airlines and travelers.

Various methods for solving the problem caused by EMI from electronic devices aboard aircraft have been proposed. For example, one solution is to provide a shield within the electronic devices themselves. However, if a user modifies the device or damages the device through mishandling or extreme wear and tear, potentially dangerous emissions may escape the device. Further, many electronic devices are cheaply made, lack emissions safeguards and their cost would be significantly increased if additional shielding was required.

Devices for shielding an aircraft from lightning and from external EMI (e.g., from TV and radio transmission towers) are known. However, these devices do not shield against EMI generated by electronic devices aboard the aircraft.

The aircraft structure itself offers some protection to aircraft components, such as antennae, from internally generated EMI; however, with the growing use of composites in the aircraft structure less inherent shielding is provided than with a metal structure. Additionally, although various solutions have been proposed for providing lightning protection for composite aircraft, many of these solutions use antistatic materials rather than EMI blocking conductive materials. Also, even in conventional aluminum skin aircraft, passenger windows provide a point of egress for EMI.

Another solution which has been implemented is to simply ban the use of portable electronic devices during all or a portion of the flight. However, as technology becomes more portable and as increasing numbers of people rely on flight time to increase productivity, it becomes a nuisance to be denied the right to use portable electronic devices aboard an aircraft.

Therefore, some form of shielding is required to prevent the electromagnetic radiation generated by electronic devices aboard an aircraft from affecting the aircraft's avionics and other electronic equipment during flight if electronic devices are to be allowed to be used during all parts of a flight.

SUMMARY OF THE INVENTION

It is an object of the present invention to provide a device for protecting an aircraft's avionics and other electronic equipment from electromagnetic interference generated by electronic devices used by passengers or by electronic devices located in the passenger or cargo compartment.

It is another object of the present invention to provide an electromagnetic shield which surrounds an aircraft passenger compartment and prevents electromagnetic radiation generated by electronic devices used by passengers from escaping the aircraft passenger compartment and interfering with the aircraft's avionics and other aircraft electronic equipment.

It is another object of the present invention to provide an electromagnetic shield which surrounds an aircraft cargo compartment and prevents electromagnetic radiation generated by electronic devices in the cargo compartment from escaping the aircraft cargo compartment and interfering with the aircraft's avionics and other aircraft electronic equipment.

It is a further object of the present invention to provide a shield which surrounds an aircraft passenger compartment and prevents signals from cellular phones from escaping the passenger compartment and adversely affecting multiple cell sites which are within the line of sight of the airborne cellular phone.

It is another object of the present invention to provide a shield for an aircraft which provides additional lightning protection for the passenger compartment especially in light of new composite aircraft.

It is another object of the present invention to provide a conductive shielding for the passenger and cargo compartments of an aircraft to block electromagnetic interference from devices which are used to intentionally interfere with aircraft avionics and other aircraft electronic equipment.

The above objects of the present invention are achieved by providing a device for shielding an aircraft's avionics and other electronic aircraft electronic equipment from electromagnetic radiation generated by electronic devices used during flight in a passenger compartment or in a cargo compartment of the aircraft. The device includes a contiguous conductive shield which is positioned between the passenger compartment and the avionics and other aircraft electronic equipment and which is also positioned between the cargo compartment and the avionics and other aircraft electronic equipment. The conductive shield electrically isolates the compartments which it surrounds and the shield may surround each of the passenger compartment and cargo compartment. However, the conductive shield may surround only the passenger compartment or only the cargo compartment. Alternatively, the shield may partially surround the passenger compartment or cargo compartment. The contiguous conductive shield may be of a wire mesh, metallic foil, or metallic spray coating which blocks electromagnetic radiation. The contiguous conductive shield may be constructed of copper, gold, aluminum or any other conductive material which blocks electromagnetic radiation having frequencies which may interfere with the aircraft avionics and other aircraft electronic equipment. Passenger windows are incorporated into the contiguous shield by fine wire mesh, metallic foil, thin metallic spray coatings or other conductive coatings. Additional objects and advantages of the present invention will be set forth in part in the description which follows, and, in part, will be obvious from the description or may be learned from the practice of the invention. These and other objects and advantages of the present invention will become apparent and more readily appreciated from the following description of the preferred embodiments taken in conjunction with the accompanying drawings.

BRIEF DESCRIPTION OF THE DRAWINGS

FIG. 7 is a view of an aircraft door showing an example of an arrangement of the protective shield around the door in accordance with the present invention; and FIG. 8 is a view of an aircraft door showing an example of an arrangement of the protective shield around the door in accordance with the present invention.

DESCRIPTION OF THE PREFERRED EMBODIMENTS

Figure 1:
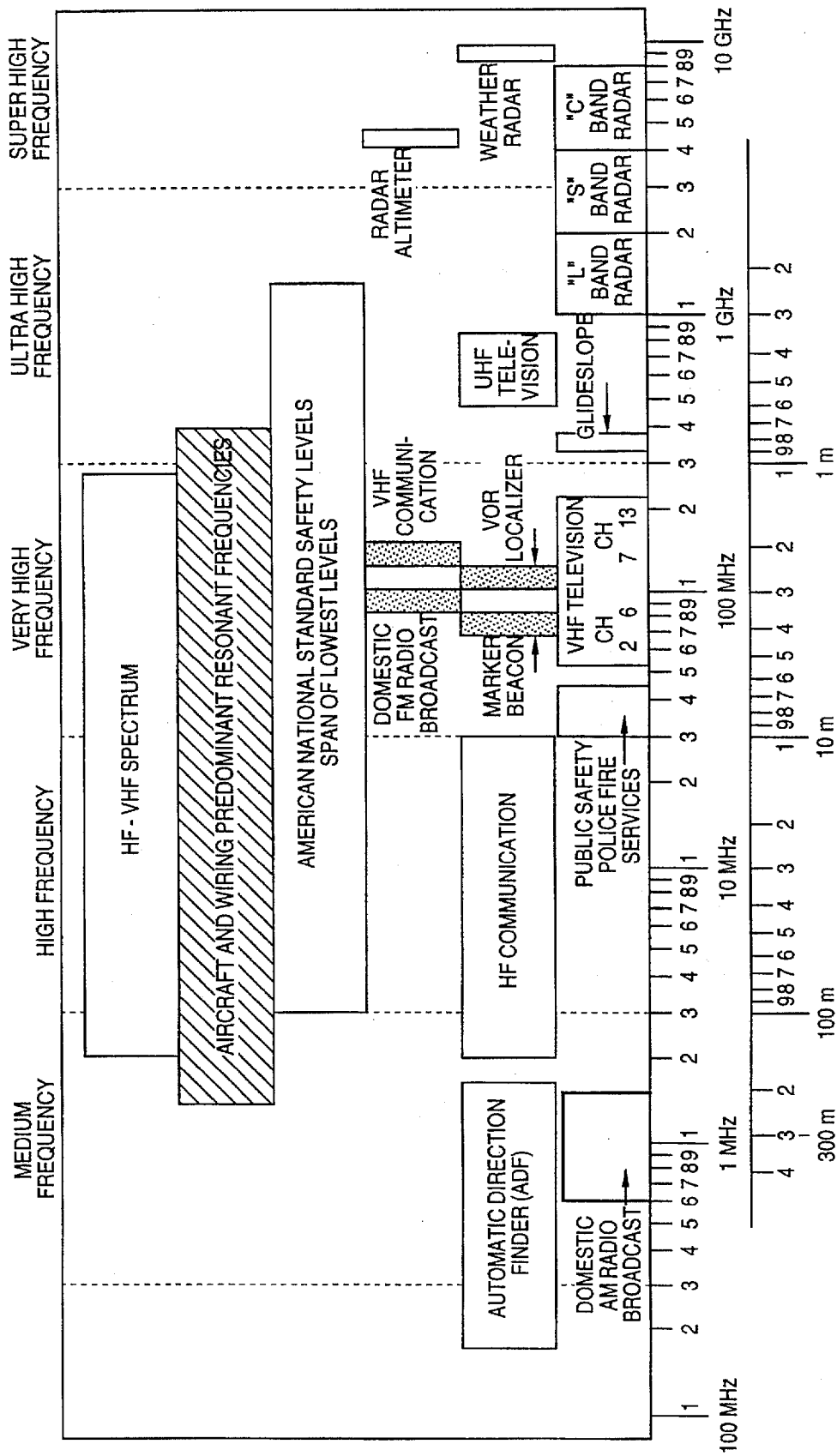
FIG. 1 is a chart showing an example of frequencies at which aircraft avionics operate and comparative frequencies of some electromagnetic radiation sources.
Figure 2:
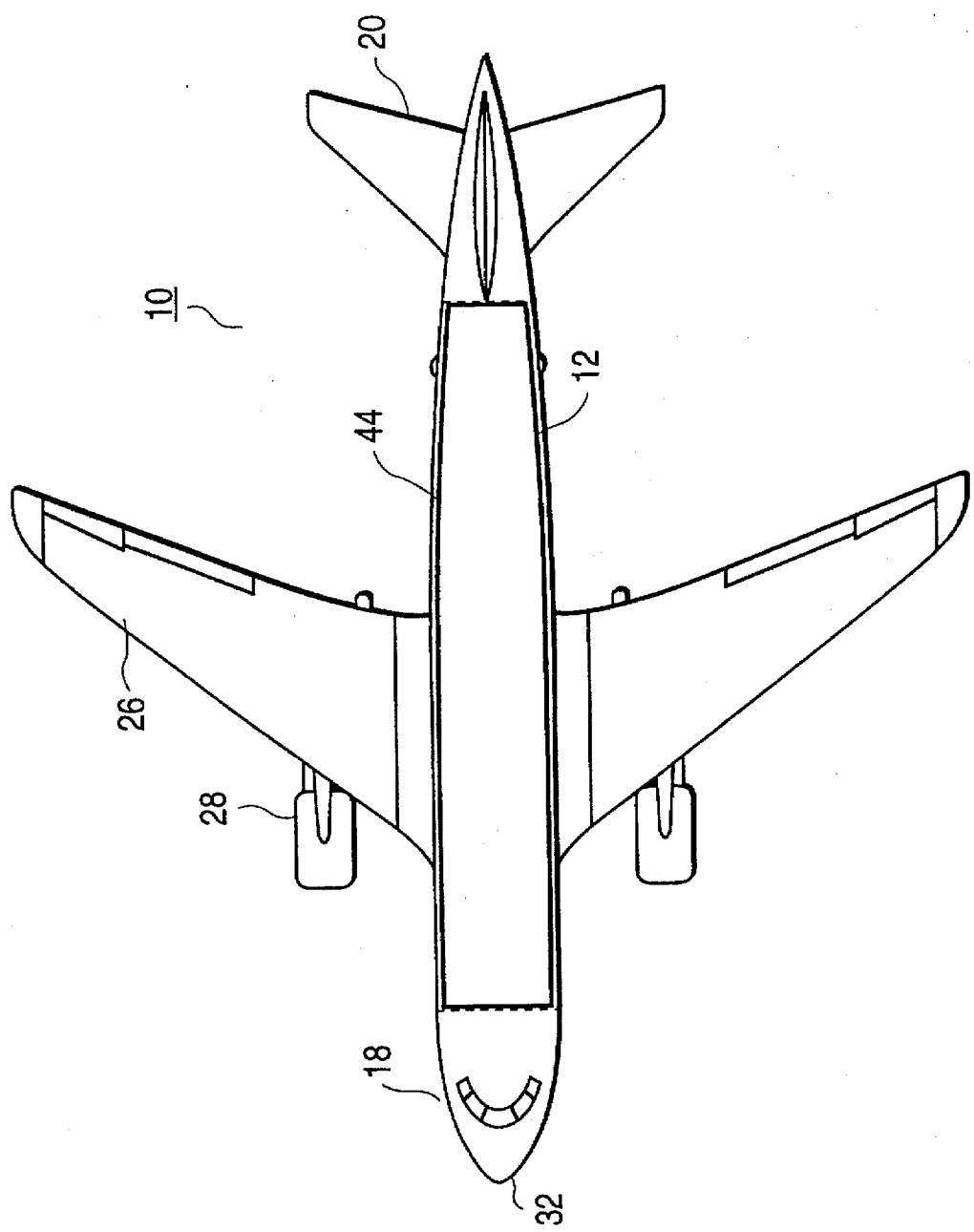
FIG. 2 is a top view of an aircraft showing the location of the protective shield in relation to the aircraft avionics and other electronic equipment in accordance with the present invention.
Figure 3:
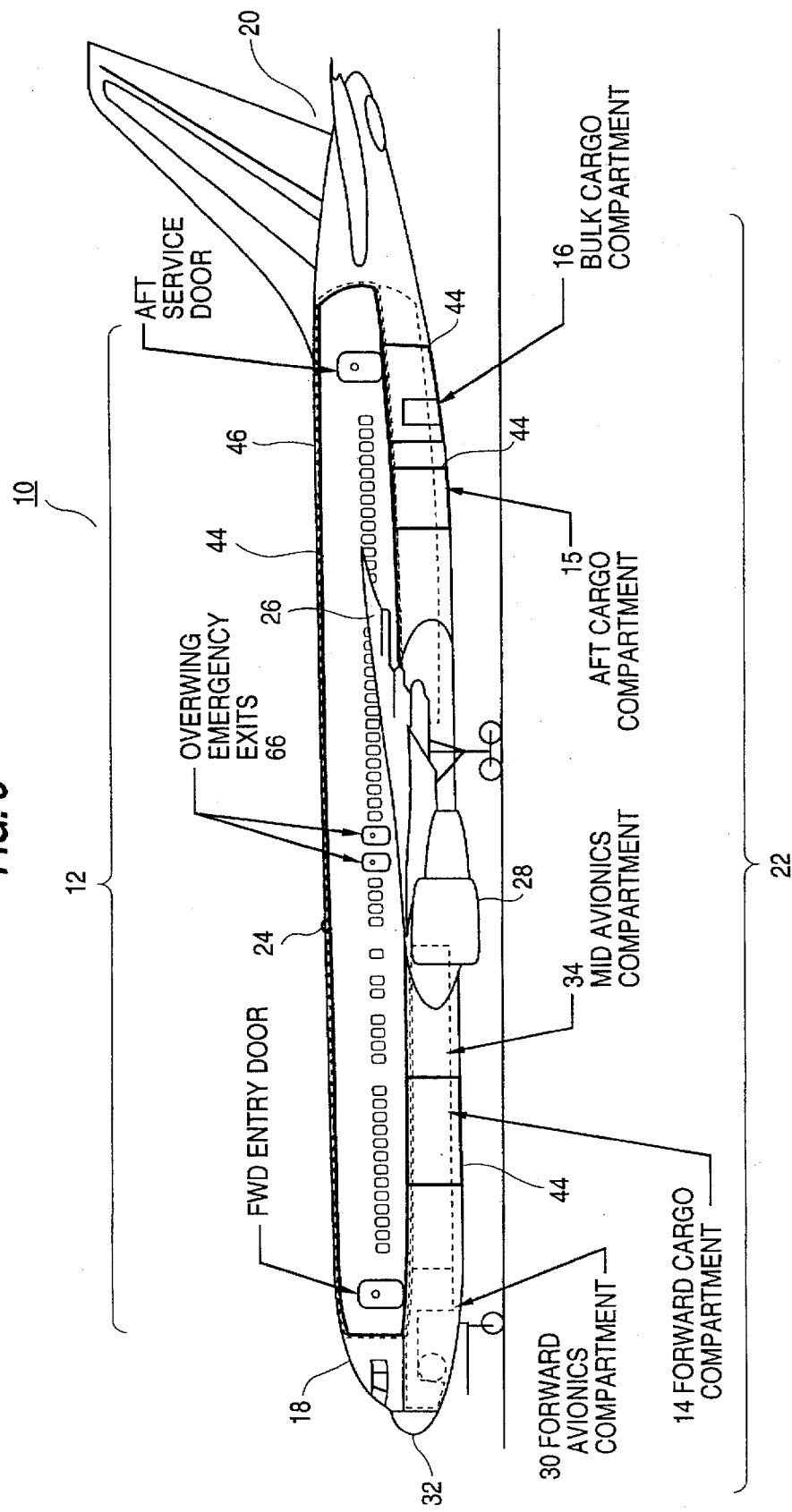
FIG. 3 is a side view of an aircraft showing the location of the protective shield in relation to the aircraft avionics and other electronic equipment in accordance with the present invention.

Referring now to the drawings, wherein like reference numerals designate identical or corresponding parts throughout the several views, and more particularly to FIGS. 2 and 3, a top view and a side view, respectively, of an aircraft 10 in accordance with the preferred embodiment of the present invention are shown. By way of example, the aircraft 10 illustrated in the figures is a commercial jet airliner. However, the present invention may be applied to aircraft of all varieties which have avionics and other aircraft electronic equipment which may be susceptible to interference caused by electromagnetic radiation generated by electronic devices used by a passenger or passengers aboard the aircraft, or generated by an electronic device located within the passenger compartment or located within a cargo compartment. For example, the present invention applies to composite type aircraft and to metallic aircraft. The present invention also applies to all varieties of aircraft such as fixed wing and rotor wing, single-engine, multi-engine and no-engine, visual flight regime (VFR) equipped, instrument flight regime (CIFR) equipped, lighter-than-air, commercial and private. As used herein, avionics and other electronic equipment refers to communication equipment, flight instrument electronics, antennae, wiring, flight control electronics, weather related electronics, guidance electronics, safety related electronics, autopilot, navigation equipment, avionics equipment, "fly-by-wire" systems and other electronic gear associated with the flight and operation of the aircraft 10.

As seen in FIGS. 2 and 3, a passenger compartment of the aircraft 10 is generally referred to by the reference numeral 12. Electronic devices, such as radios, compact disc players, video games, cellular phones, laptop computers, electric shavers, etc. are commonly used by passengers who are seated in the passenger compartment 12 during flight. Cargo compartments for the aircraft 10 are typically located in an area below the passenger compartment 12. For example, the aircraft 10 includes a forward cargo compartment 14, an aft cargo compartment 15, and a bulk cargo compartment 16 (FIG. 3). Electronic devices may also be located in the cargo compartments 14, 15, 16.

As is well known, the electronic devices give off electromagnetic radiation during their operation. When an electronic device is operating during flight, depending upon factors such as the strength of the electromagnetic radiation generated by an individual electronic device, the frequency of the electromagnetic radiation, and the number of electronic devices operated at the same time, the electromagnetic radiation generated may escape the passenger compartment 12 and may propagate to other areas of the aircraft 10, such as the cockpit 18 located forward of the passenger compartment 12, the tail section 20 located rearward of the passenger compartment 12, the belly 22 of the aircraft 10 located below the passenger compartment 12, and the roof 24 of the aircraft 10 located above the passenger compartment 12. Because the exterior of the aircraft 10 may be metal the signals can be reflected throughout the interior of the aircraft 10 for a considerable length of time. It is also possible for the electromagnetic radiation emitted by the electronic devices to escape the passenger compartment 12, reflect off a wing 26 or engine 28 of the aircraft 10, and interfere with navigation, communication, or other antennae on the exterior of the aircraft 10.

The avionics and other electronic equipment for the aircraft 10 are found in various portions of the aircraft 10. For example, flight control computers and navigational radar may be located in the "E and E" or forward avionics compartment 30 often underneath the cockpit 18 or the forward portion of the passenger compartment 12; other avionics equipment may be located in the mid avionics compartment 34 in the belly 22, rear of the forward cargo compartment 14; communications and radar antennae may be located forward of the wing root on the exterior of the belly 22, roof 24 or nose 32; and wiring, fly-by-wire circuits and avionics cabling may be located in the frame of the aircraft 10 and along a trough beneath the passenger compartment 12 and above the cargo compartments 14, 15, 16 in the belly 22.

Figure 4:
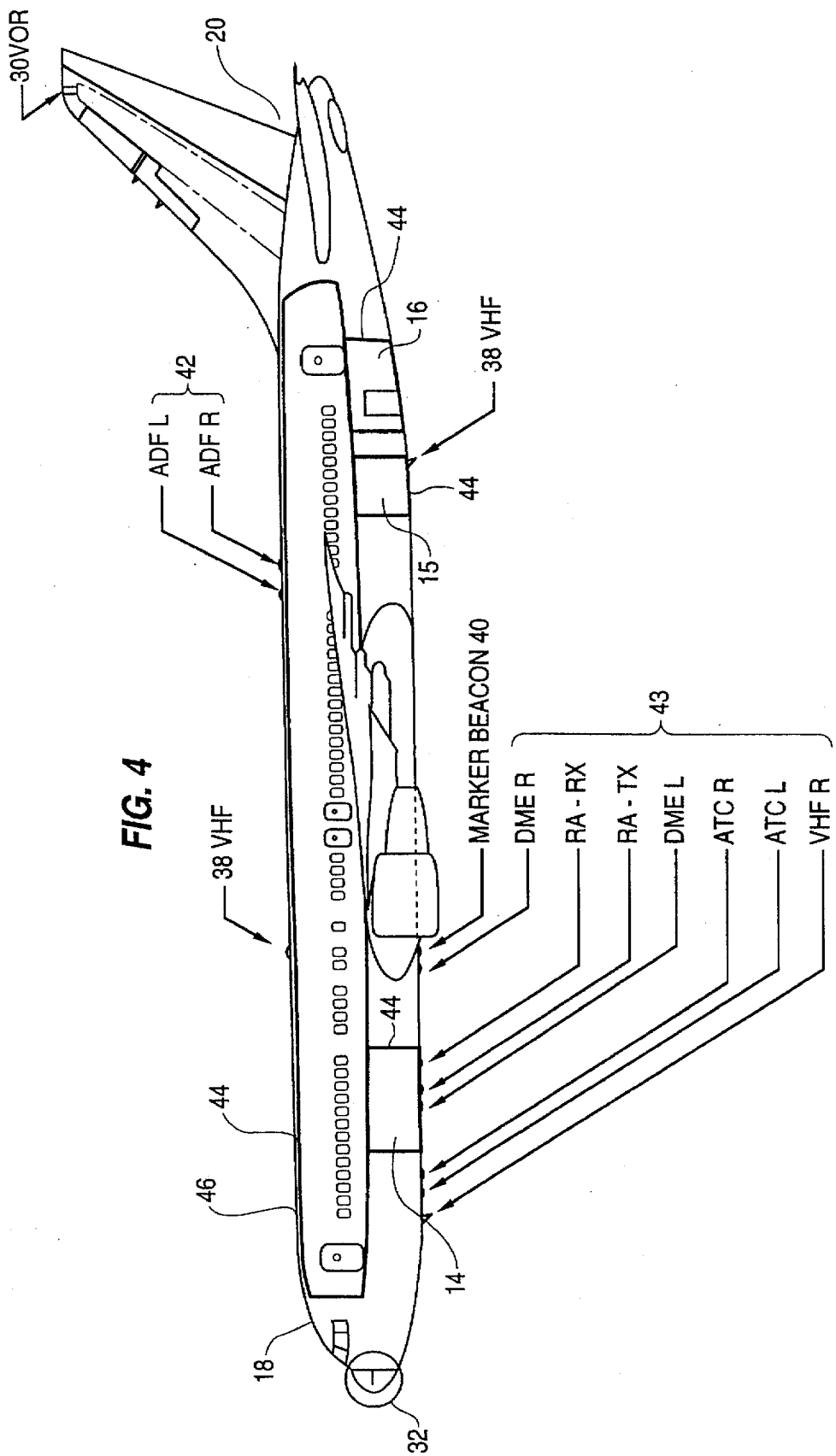
FIG. 4 is a side view of an aircraft showing the location of the protective shield in relation to aircraft antennae in accordance with the present invention.

FIG. 4 is a side view of the aircraft 10 showing the location of antennae of the aircraft 10. These antennae include those for VHF omni-directional receiver (VOR) 36 located in the tail 20, very high frequency (VHF) 38, Marker Beacon 40, automatic direction finder (ADF) 42, Glideslope, Localizer, and RADAR located in the nose 32 and other antennae generally located underneath the aircraft as indicated by reference character 43 as shown in FIG. 4.

As is well known, if the frequencies of the electromagnetic radiation generated by the electronic devices aboard the aircraft, or any harmonics of the frequencies generated, coincide with the frequencies at which the aircraft avionics and other electronic equipment operate and have a signal strength approaching or equaling the signal strength at which the avionics and other electronic equipment operate, the avionics and other electronic equipment may be confused or disabled by these interfering signals.

As seen in FIGS. 2, 3, and 4, in accordance with the preferred embodiment of the present invention, to prevent the electromagnetic radiation generated by the electronic devices from escaping the passenger compartment 12, and to thereby prevent interference with the aircraft's avionics and other electronic equipment, the passenger compartment 12 is electrically isolated by a contiguous conductive shield 44 which completely surrounds the passenger compartment 12. The shield 44 may also electrically isolate the cargo compartments 14, 15, 16 by completely surrounding the cargo compartments 14, 15, 16 to prevent electromagnetic radiation from devices located in these areas from escaping and interfering with the avionics and other electronic equipment. By completely surrounding the passenger compartment 12 or the cargo compartments 14, 15, 16 is meant that the contiguous conductive shield 44 surrounds the passenger compartment 12 and cargo compartments 14, 15, 16 such that no opening in the shield exists which is large enough for electromagntic radiation from an electronic device within the shield 44 to penetrate the shield 44 through the opening, and that all of the aircraft's avionics and other electronic equipment, including wires, cables and antennae are exterior to the contiguous conductive shield 44. Wires related to passenger compartment 12 or cargo compartment 14, 15, 16 lighting, video, sound, airphones, etc. may either be wholly located within the conductive shield 44 if the associated equipment is also within the shield 44, or the wires may pierce the conductive shield 44 through holes which are kept at a minimum diameter which is smaller than a diameter required to block signals at that location.

The shield 44 is designed to absorb signals emitted by electronic devices which are operated in the passenger compartment 12 or which are located in the passenger compartment 12 or baggage compartments 14, 15, 16, such that the signals are harmlessly dissipated before reaching any of the aircraft's vital avionics or other electronic equipment. The shield 44 also provides added protection against lightning strikes for the passenger's electronic devices, and by absorbing emissions from cellular phones the shield 44 prevents signals from cellular phones from escaping the passenger compartment 12 and adversely affecting multiple cell sites which are in the line of sight of the airborne cellular phone.

As seen in FIGS. 3 and 4, in accordance with the preferred embodiment, the contiguous shield 44 surrounds the passenger compartment 12 such that the contiguous shield 44 electrically isolates the passenger compartment 12 from the cockpit 18, the tail section 20, the exterior skin 46, and the belly 22 of the aircraft 10 where vital avionics and other electronic equipment are located. The contiguous shield 44 also prevents electromagnetic radiation from electronic devices in the passenger compartment 12 from escaping the passenger compartment 12, propagating outside the aircraft 10, reflecting off the wing 26 or engine 28 and interfering with the navigational, radar and communications antennae which are mounted on the exterior of the aircraft 10.

Furthermore, as seen in FIGS. 3 and 4, the contiguous conductive shield 44 electrically isolates the cargo compartments 14, 15, 16 by surrounding the cargo compartments and preventing electromagnetic radiation from devices located in these areas from escaping the cargo compartments 14, 15, 16 and interfering with the aircraft avionics and other electronic equipment. The contiguous conductive shield 44 may be a well known Faraday cage which is known to block electromagnetic radiation by reflecting, absorbing and dissipating radio frequency signals. The shield 44 may be of a wire mesh construction, or may be a series of parallel wires. The shield 44 is preferably made of copper; however, the shield 44 may be constructed of other materials such as gold, aluminum, silver, conductive polymer, or other materials, which reflect, absorb, and dissipate electromagnetic radiation. Alternatively, the shield 44 may be constructed of a thin conductive foil, may be applied as a metallic spray coating, or may be constructed of any other material or applied in any other manner which creates a Faraday cage.

In accordance with the preferred embodiment, the shield 44 must block at least those frequencies of electromagnetic radiation which fall in a range at which the aircraft avionics and other electronic equipment operate. Therefore, since aircraft avionics and other electronic equipment are known to operate in a frequency range of 100 KHz to 10 GHz, the narrowest range of frequencies of electromagnetic radiation which must be blocked by the shield 44 is from 100 KHz to 10 GHz.

The important characteristics of the shield 44 which affect its ability to block electromagnetic radiation are the conductivity characteristics of the shielding medium, and the thickness and the geometry of the shielding medium. Conductivity of the shield 44 is determined by the type of a material used, such as copper, aluminum, gold, silver, conductive polymer, etc. . . . and the cross-sectional area. The shield 44 should have a thickness which makes the shield 44 as light weight as possible while still blocking the desired electromagnetic radiation frequencies to a degree which is acceptable. Based on the above-described considerations, the minimum thickness of the shield 44 required to block a large percentage of electromagnetic radiation having a wavelength of up to 10 GHz is 10 nm. By way of example, when using a foil shield, a foil thickness of 0.01 mm (10,000 nm) is suitable and foil of this thickness is commonly available. When using a wire mesh shield, wire of 0.1 mm diameter (38 gauge) is suitable and is also commonly available. The thicker the shield 44, the greater the blockage of electromagnetic radiation.

The size of any hole or aperture in the shield 44 must be such that the smallest wavelength of radiation which may affect the aircraft avionics and other electronic equipment is blocked by the shield 44. In particular, when the shield 44 is wire mesh the mesh spacing must not allow electromagnetic radiation through which will affect the avionics and other electronic equipment. A mesh spacing that is limited to a maximum spacing of one-half the size of the smallest wavelength of electromagnetic radiation that must be blocked will provide the required shielding. To effectively stop 10 GHz radiation, any holes in the shield 44 as a result of the mesh spacing or any other cause must not be greater than 1.5 cm since the wavelength of 10 GHz radiation is 3 cm as calculated by the formula wavelength(m)=speed of light (m/sec)/frequency(Hz).

The above values for thickness of the shield 44 and mesh spacing of the shield 44 are the lower and upper limits, respectively, for these values, and, of course, the shield 44 may be thicker and have smaller holes or mesh spacing. However, if lower frequency electromagnetic radiation must be blocked the hole size can be bigger. Preferably, the mesh spacing and thickness of the shield 44 are chosen to make the shield 44 as light weight as possible while still blocking the desired electromagnetic radiation frequencies.

Furthermore, although the preferred embodiment of the present invention has been described with respect to blocking electromagnetic radiation in a range of 100 KHz to 10 GHz, the shield 44 may be designed to block a broader or narrower range of frequencies by adjusting the thickness and the size of any opening in the shield 44.

Figure 5:
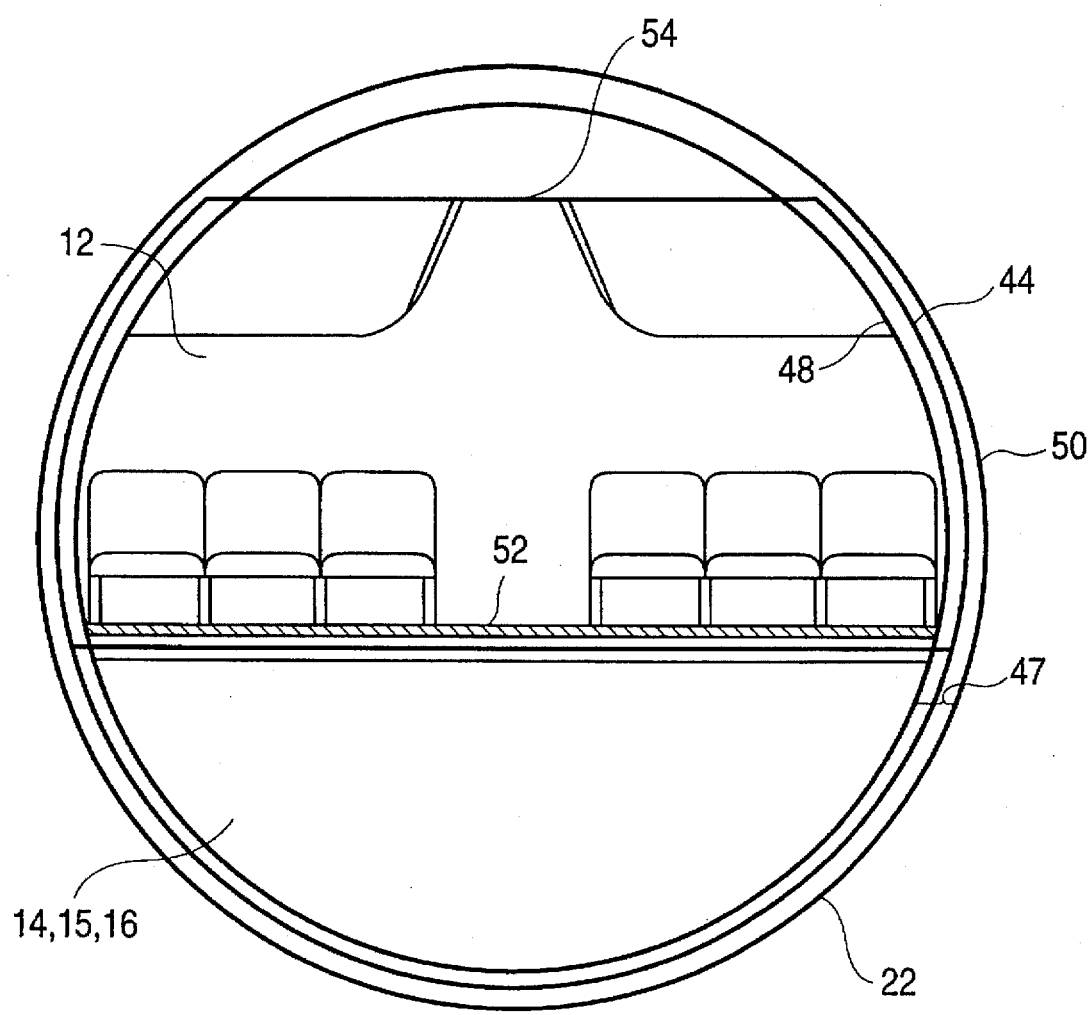
FIG. 5 is a cross-sectional view of an aircraft having a protective shield in accordance with the present invention.

FIG. 5 is a cross-sectional view of the aircraft 10 with a protective shield 44 in accordance with the preferred embodiment of the present invention. The exterior skin 47 of the aircraft 10 includes an inner wall 48 and an outer wall 50. The shield 44 is preferably attached or spray coated to the aircraft 10 in a space between the inner wall 48 and the outer wall 50, and beneath a floor 52 and above a ceiling section 54 of the passenger compartment 12. The shield 44 is preferably attached to the outside surface of the inner wall 48 or to the inside surface of insulation panels (not shown). The shield 44 may be incorporated as part of the wallpaper or plastic panels which decorate the interior of the passenger compartment 12. The shield 44 may also be made part of the wall, ceiling and floor panels forming the passenger compartment 12. However, regardless of where the shield 44 is attached to the aircraft structure, in accordance with the preferred embodiment of the present invention, it is required that the shield 44 electrically isolate the passenger compartment 12 from the aircraft avionics and other electronic equipment to prevent any electromagnetic radiation generated by electronic devices in the passenger compartment 12 from affecting the avionics and other equipment. The shield 44 also electrically isolates the cargo compartments 14, 15, 16 and is attached to the aircraft structure, and the walls, ceilings and floor of the cargo compartments 14, 15, 16 in a manner similar to that described above for the passenger compartment 12.

The shield 44 may be adhesively attached to the aircraft structure using any suitable adhesive. When the shield 44 is a wire mesh or thin metallic foil, the shield may include several sections which form the contiguous shield. At a place where a joint between two sections is formed, the sections must be attached such that no significant space occurs at a seam between sections. By significant space is meant a hole or any aperture providing an opening greater than 1.5 cm. An overlapping of the two sections can ensure that no space between sections exists so that no signals escape the shield 44. By surrounding each section with a conductive strip on the edge of each section, the sections can be easily conductively joined together. At seams between conductive panels, the seam should preferably have a dc resistance of less than 1 ohm.

To electrically isolate the passenger compartment 12 and cargo compartments 14, 15, 16 to prevent all significant electromagnetic radiation interference from escaping, it is of particular importance that the windows, doorways, any joints or complex geometries in the aircraft structure which may allow signals from electronic devices to escape the passenger compartment 12 also be shielded.

Figure 6:
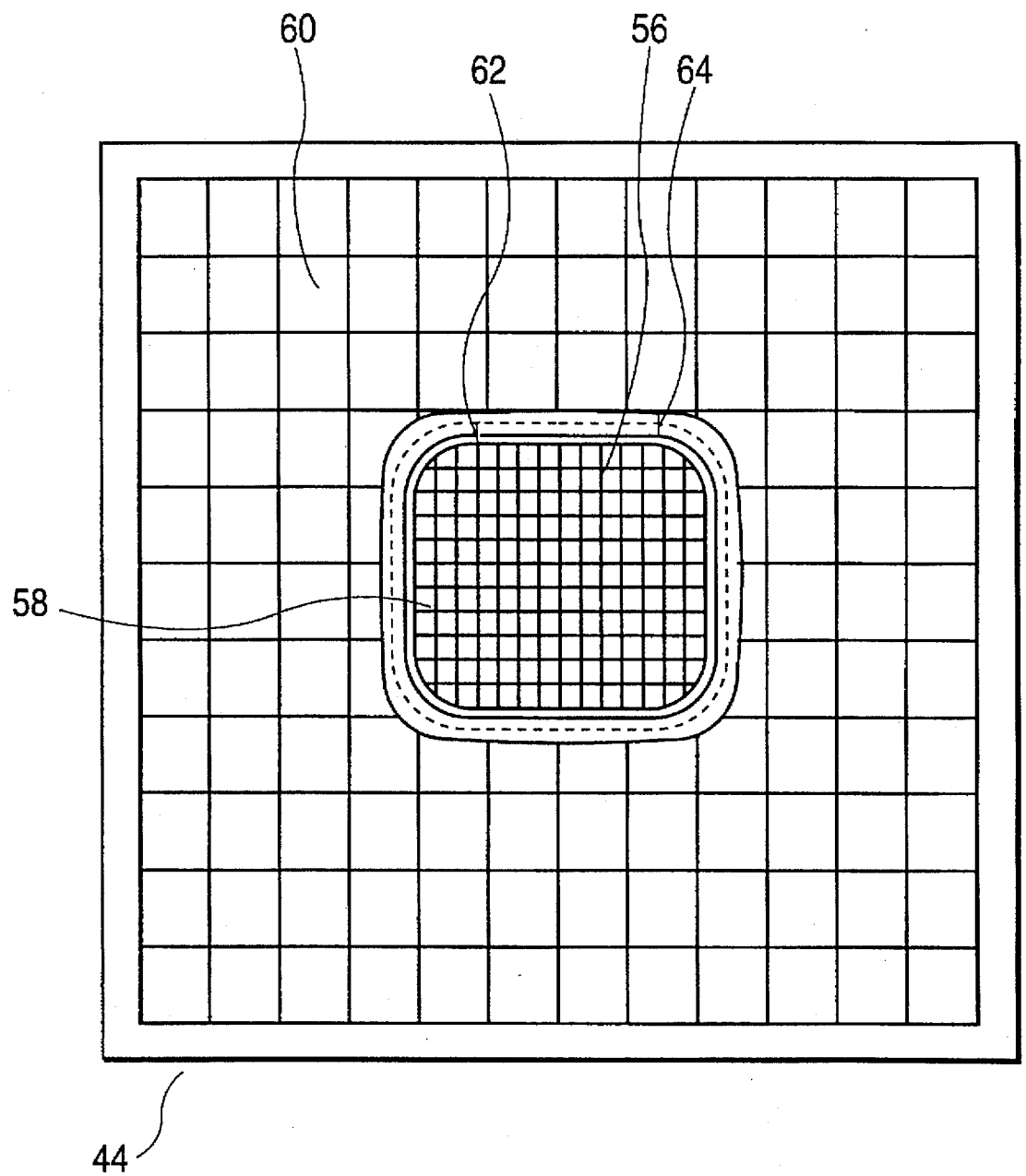
FIG. 6 illustrates incorporation of a window into the shield in accordance with the present invention.

As seen in FIG. 6, in accordance with the preferred embodiment, a window 56 is incorporated into the shield 44 by either covering the window 56 with wire mesh or incorporating the wire mesh as part of the window 56. The wire mesh which provides shielding for the window 56 may be finer than the wire mesh which provides shielding for non-window areas to allow viewing through the window 28. If the wire mesh providing shielding for the window 56 is finer than the wire mesh which surrounds the rest of the passenger compartment 12, to maintain proper conductivity the wire mesh shielding the window 56 may have a smaller mesh spacing relative to the wire mesh surrounding non-window areas of the passenger compartment 12 to accommodate a greater number of wires. However, it is not required that the mesh spacing for the wire mesh shielding the window 56 be finer than the mesh spacing for non-window areas and the mesh spacing for window areas may be identical to the mesh spacing for non-window areas.

The shield 44 should preferably have continuity such that signals do not escape through a seam in the shield 44 between a section of shield 58 covering the window 56 and a section of shield 60 surrounding the window 56. To ensure continuity in the shield 44, the section of shield 58 covering the window 56 includes a ring 62 of conductive material on its outer edge which surrounds the window 56. The section of shielding 60 surrounding the window 56 includes a conductive ring 64 which surrounds the window 56 and overlaps the conductive ring 62 to provide continuity in the shield 44 around the window 56.

Alternatively, the windows may be covered with a thin foil shield which partially transmits light. The windows may be coated with a conductive polymer or transparent conductive polymer which absorbs signals of the desired frequencies, as are well known in the conductive polymer arts. In pressurized aircraft having an inner plastic window and a pressurized window, it may be more economical to incorporate the shielding 44 into the inner plastic window rather than the expensive pressurized window (especially when retrofitting existing aircraft).

It is important that the shield 44 seal all joints and doorways such as the doorway of the cockpit 18, emergency exits 66 (FIG. 3), and access panels to other areas of the aircraft 10 such as the "E and E" compartment 30. Specifically, the shield 44 must seal all joints and doorways such that there is no exit point where a signal from a an electronic device in the passenger compartment 12 or cargo compartments 14, 15, 16 may escape. To provide a seal at a joint, such as a doorway, a portion of the shield 44 which covers the door and a portion of the shield 44 which surrounds the door must overlap in a manner which prevents a gap in the shield 44 large enough for a signal to escape.

FIG. 7 shows an example of a door and door frame in the aircraft 10 which is sealed by the shield 44 in accordance with the present invention. As seen in FIG. 7, a door 68 includes a section 70 which juts out from the body of the door 68 and is covered by a section of shield 44a. A section of the wall 72 of the passenger compartment 12 which forms a door frame 74 and into which the jutting section 70 of the door 68 fits is lined with a section of shield 44b such that, when the door 68 is closed, a seal is formed by the jutting section of the door 70 and the door frame 74, and no path for a signal to escape is provided through a point between the door 68 and door frame 74. A signal which enters a joint created by the door 68 and door frame 74 is dissipated by either the section of shield 44a lining the door 68 or the section of shield 44b on the door frame 74 which overlap to seal the door.

FIG. 8 shows another example of a door 68 in the aircraft 10 which is sealed by the shield 44 in accordance with the present invention. The door 68 includes a corrugated section 76 which fits into a set of opposing indentations 78 in the door frame 74. The section of shield 44a which covers the door 68 also covers the corrugated section 76. The section of shield 44b which covers the door frame 74 also covers the opposing indentations 78 in the door frame 74. When the door 68 is shut the corrugated section 76 covered by the section of shield 44a and the opposing indentations 78 which are each covered by the section of shield 44b meet to form a seal such that a signal from an electronic device cannot escape passenger compartment 12 or cargo compartments 14, 15, 16 having a doorway. If the seal between the door 68 and frame 74 is pressurized, an even better seal is formed. Pressure applied mechanically to the hinge and locking mechanism in a manner similar to the 1950's refrigerators will provide an even better seal for the doorways.

A seam or gap created by an opening in the passenger compartment 12 or cargo compartments 14, 15, 16 may also be sealed using a conductive sealing tape such as that disclosed in U.S. Pat. No. 5,126,185 which is hereby incorporated by reference.

Although the preferred embodiment of the present invention has been shown and described with respect to a shield 44 which electrically isolates the passenger compartment and/or the cargo compartments of an aircraft 10 to block electromagnetic radiation originating therein from emanating from these compartments, the shield of the present invention may also be configured to only partially surround a compartment or compartments of the aircraft 10. For example, when the avionics equipment and antennae in an aircraft are only located in the forward portion of the aircraft, a conductive shield which separates and electrically isolates only the forward portion of the aircraft from the passenger and cargo compartments will prevent electromagnetic radiation from electronic devices from reaching the avionics and antennae.

Furthermore, in the case of an aluminum skin aircraft, the outer conductive skin of the aircraft may be made electrically contiguous with other conductive elements, such as conductive windows, floor panels, and the wall separating the passenger compartment 12 from the cockpit. By utilizing the conductive properties of the skin of the aircraft in combination with shielding certain areas (e.g., windows, floor panels, walls separating compartments, etc.) with a conductive shield, as described above, the aircraft avionics and other electronic equipment may be shielded with the advantage that weight, fuel expense, and installation cost may be saved because the aircraft skin provides shielding. The bonding between these shielded elements and the outer conductive skin must ensure conductivity and must be robust to withstand separating forces. Avionics and other equipment wiring must be topologically exterior to the passenger and cargo compartments.

Although a few preferred embodiments have been shown and described, it will be appreciated by those skilled in the art that changes may be made in these embodiments without departing from the principles and spirit of the invention, the scope of which is defined in the appended claims and their equivalents.

I claim:

1. A device, comprising:
   a conductive shield positioned surrounding a compartment of an aircraft, aircraft avionics and other aircraft electronic equipment being located outside the compartment, and the shield protecting the avionics and the other electronic equipment from electromagnetic interference generated within the compartment.

2. A device as recited in claim 1, wherein the compartment, surrounded by the conductive shield, is a passenger compartment.

3. A device as recited in claim 1, wherein the compartment, surrounded by the conductive shield, is a cargo compartment.

4. A device as recited in claim 1, wherein the compartment, surrounded by the conductive shield, is at least one of a passenger compartment and a cargo compartment.

5. A device as recited in claim 1, wherein the conductive shield comprises a Faraday cage.

6. A device as recited in claim 1, wherein the conductive shield comprises a wire mesh.

7. A device as recited in claim 1, wherein the conductive shield comprises a metallic foil.

8. A device as recited in claim 1, wherein the conductive shield comprises a metallic spray coating.

9. A device as recited in claim 6, wherein the wire mesh is copper.

10. A device as recited in claim 7, wherein the metallic foil is copper.

11. A device as recited in claim 1, wherein the conductive shield surrounding the compartment comprises a conductive surface blocking at least that electromagnetic interference having a frequency ranging from 100 KHz to 10 GHz.

12. A device as recited in claim 1, wherein the conductive shield has a thickness of at least 10 nanometers.

13. A device as recited in claim 2, wherein the conductive shield is contiguous and completely electrically isolates the passenger compartment.

14. A device as recited in claim 2, wherein the conductive shield partially electrically isolates the passenger compartment.

15. A device for protecting an aircraft's electronic control equipment from electromagnetic interference generated by passenger devices operated in a passenger compartment, comprising:

a conductive shield surrounding the passenger compartment, excluding aircraft avionics and other electronic equipment, with the avionics and the other electronic equipment being exterior to the shield and keeping the electromagnetic interference generated by the passenger devices contained within the shield.

16. A device as recited in claim 15, wherein said shield is a contiguous conductive shield comprising a plurality of panel sections, each panel section having a strip of conductive material surrounding the panel section and connecting adjacent panel sections.

17. A device as recited in claim 15, wherein the aircraft passenger compartment comprises an exterior skin and an inner wall, and the conductive shield is attached to the passenger compartment between the inner wall and the exterior skin.

18. A device as recited in claim 15, wherein the passenger compartment includes ceiling, wall and floor panels and the conductive shield is adapted to be a part of the ceiling, wall and floor panels of the passenger compartment.

19. A device as recited in claim 15, wherein the shield is copper mesh.

20. A device as recited in claim 15, wherein the passenger compartment includes a window, and further comprising the window including a conductive polymer shield connected to the conductive shield and covering the window.

21. A device as recited in claim 20, wherein the conductive polymer shield is transparent.

22. A device as recited in claim 15, wherein the shield is attached to an inner wall of the aircraft passenger compartment.

23. A device as recited in claim 15, wherein the shield is adhesively attached.

24. A device as recited in claim 15, wherein the passenger compartment includes a window; and wherein said conductive shield comprises:

a panel section surrounding said window and including a conductive ring section which conforms to a shape of said window; and a window section of said shield covering said window and including a conductive ring surrounding said window, and with the conductive ring of the panel section overlapping the conductive ring surrounding said window.

25. A device as recited in claim 23, wherein said window section comprises one of a conductive polymer and a conducting mesh.

26. A device, comprising:

a conductive shield surrounding a passenger compartment of an aircraft, the passenger compartment not including aircraft avionics and other aircraft electronic equipment, the passenger compartment having a window, and said shield comprising one of a conductive polymer or a conductive mesh included within the window.

27. A device for protecting aircraft electronic equipment from electromagnetic radiation, comprising:

an electromagnetic radiation shield surrounding a passenger compartment, the compartment including passenger devices generating the electromagnetic radiation, the passenger compartment including a window and a door having a door frame, said shield comprising:

copper mesh wall panels in walls of the passenger compartment, each of said wall panels including respective conductive rings surrounding the copper mesh wall panels, with the conductive rings overlapping to conductively connect adjacent wall panels;

a thin conductive copper mesh window panel surrounding said window and including a conductive ring surrounding and adjacent to said window;

a conducting polymer section shielding said window and including a conductive ring which surrounds the section, with the conductive ring of the window panel surrounding the window overlapping and conductively connecting the conductive ring of the polymer section shielding the window;

a first section of copper mesh shielding covering said door; and a second section of copper mesh shielding covering the door frame to form a seal preventing the electromagnetic radiation from escaping the passenger compartment between the door and door frame when the door is closed.

28. A shield apparatus for an aircraft having a passenger compartment, comprising:

a conducting shield surrounding the passenger compartment and containing within the compartment electromagnetic energy produced by passenger devices within the compartment.

29. A shield apparatus for an aircraft having a passenger compartment and an external antenna, comprising:

a conducting shield surrounding the passenger compartment and containing within the compartment electromagnetic energy produced by passenger devices within the compartment and preventing the energy from irradiating the antenna.

30. An apparatus, comprising:

an aircraft having a passenger compartment, an avionics compartment separate from the passenger compartment containing passenger devices producing electromagnetic energy and an antenna extending external of the aircraft; and a electromagnetically conductive shield surrounding the passenger compartment and keeping the electromagnetic energy produced by the devices within the passenger compartment and preventing the electromagnetic energy from irradiating the antenna and the avionics compartment.

* * * * *